US010629760B2

(12) United States Patent
Smith et al.

(10) Patent No.: US 10,629,760 B2
(45) Date of Patent: Apr. 21, 2020

(54) METHOD OF FABRICATING AN EMITTER REGION OF A SOLAR CELL (71) Applicant: SunPower Corporation, San Jose, CA (US)

(72) Inventors: David D. Smith, Campbell, CA (US); Helen Liu, El Cerrito, CA (US); Tim Dennis, Canton, TX (US); Jane Manning, Woodside, CA (US); Hsin-Chiao Luan, Palo Alto, CA (US); Ann Waldhauer, La Honda, CA (US); Genevieve A. Solomon, Palo Alto, CA (US); Brenda Pagulayan Malgapu, Cavite (PH); Joseph Ramirez, Batangas (PH)

(73) Assignee: SunPower Corporation, San Jose, CA (US)

( * ) Notice: Subject to any disclaimer, the term of this patent is extended or adjusted under 35 U.S.C. 154(b) by 126 days.

(21) Appl. No.: 15/601,929

(22) Filed: May 22, 2017

(65) Prior Publication Data
US 2017/0263795 A1 Sep. 14, 2017

Related U.S. Application Data (62) Division of application No. 12/890,428, filed on Sep. 24, 2010, now abandoned.

(51) Int. Cl.
*H01L 31/0368* (2006.01)
*H01L 31/18* (2006.01)
(Continued)

(52) U.S. Cl.
CPC .... *H01L 31/0368* (2013.01); *H01L 31/02167* (2013.01); *H01L 31/0376* (2013.01);
(Continued)

(58) Field of Classification Search
CPC ... H01L 33/486; H01L 33/502; H01L 33/505; H01L 33/507; H01L 33/54; H01L 33/56;
(Continued)

(56) References Cited

U.S. PATENT DOCUMENTS 5,352,636 A    10/1994  Beinglass
5,425,846 A *   6/1995  Koze ............ H01L 21/31116
                                              117/95
(Continued)

FOREIGN PATENT DOCUMENTS

CN    1719621       1/2006
JP    11-251609     9/1999
(Continued)

OTHER PUBLICATIONS

Third Office Action from Chinese Patent Office for Chinese Application No. 2016101275496 dated Apr. 27, 2018; 8 pgs.
(Continued)

*Primary Examiner* — Zandra V Smith
*Assistant Examiner* — Andre C Stevenson
(74) *Attorney, Agent, or Firm* — Schwabe, Williamson & Wyatt, P.C.

(57) ABSTRACT

Methods of fabricating emitter regions of solar cells are described. Methods of forming layers on substrates of solar cells, and the resulting solar cells, are also described.

20 Claims, 6 Drawing Sheets (51) Int. Cl.
| | |
|---|---|
| H01L 31/20 | (2006.01) |
| H01L 31/0216 | (2014.01) |
| H01L 31/0376 | (2006.01) |
| H01L 31/062 | (2012.01) |
| H01L 31/0745 | (2012.01) |

(52) U.S. Cl.
CPC ........ *H01L 31/062* (2013.01); *H01L 31/0745* (2013.01); *H01L 31/182* (2013.01); *H01L 31/1804* (2013.01); *H01L 31/1864* (2013.01); *H01L 31/1872* (2013.01); *H01L 31/1876* (2013.01); *H01L 31/202* (2013.01); *Y02E 10/547* (2013.01); *Y02P 70/521* (2015.11)

(58) Field of Classification Search
CPC ....... H01L 2933/0041; H01L 2933/005; H01L 2115/10; H01L 35/505; H01L 33/62; C09K 11/70; F21Y 2115/10
See application file for complete search history.

(56) References Cited

U.S. PATENT DOCUMENTS

| | | | |
|---|---|---|---|
| 5,566,044 | A | 10/1996 | Bergemont et al. |
| 6,121,541 | A | 9/2000 | Arya |
| 7,202,143 | B1 | 4/2007 | Naseem et al. |
| 7,468,485 | B1 | 12/2008 | Swanson |
| 7,709,307 | B2 * | 5/2010 | Kamath ............ H01L 21/28518 257/E21.68 |
| 7,737,357 | B2 | 6/2010 | Cousins |
| 2008/0035198 | A1 | 2/2008 | Teppe et al. |
| 2010/0269904 | A1 * | 10/2010 | Cousins .............. H01L 31/0745 136/258 |

FOREIGN PATENT DOCUMENTS

| | | |
|---|---|---|
| JP | 2002-026347 | 1/2002 |
| JP | 2010-186900 | 8/2010 |
| KR | 102005010229 | 10/2005 |
| KR | 20090091702 | 8/2009 |
| KR | 20090093192 | 9/2009 |
| WO | WO-2009126803 | 10/2009 |
| WO | WO 2010/065434 | 6/2010 |
| WO | WO-2010065434 | 6/2010 |
| WO | WO-2010108151 | 9/2010 |

OTHER PUBLICATIONS

Decision on Rejection for Chinese Patent Office for Chinese Application No. 2016101275496 dated Jan. 17, 2019; 6 pgs—with partial English translation of the Rejection.
Extended European Search Report from European Patent Application No. 11827139.4 dated Dec. 6, 2017, 20 pgs.
Lemiti et al., "Physical Properties of RT-LPCVD and LPCVD Polysilicon Thin Films: Application to Emitter Solar Cell," World Conference on Photovoltaic Energy, Waikoloa, Dec. 5-9, 1994, pp. 1375-1378.
Jiang et al., "Silicon solar cells with polysilicon emitters and back surface fields," Proceedings of SPIE—International Society for Optical Engineering, vol. 7750, Jun. 17, 2010, 8 pgs.
Green et al., "Understanding the Limits of Ultrathin $SiO_2$ and Si—O—N Gate Dielectrics for Sub-50 nm CMOS," Microelectronic Engineering 48 (1999) pp. 25-30.
Goodman et al., "Thin Tunnelable Layers of Silicon Dioxide Formed by Oxidation of Silicon," J. Electrochem. Soc.: Electrochemical Technology, Jul. 1970, pp. 982-984.
Borden et al., "Polysilicon Tunnel Junctions as Alternates to Diffused Junctions," $23^{rd}$ European Photovoltaic Solar Energy Conference, Sep. 1-5, 2008, pp. 1149-1152, Valencia, Spain.
Hatalis et al., "Large grain polycrystalline silicon by low-temperature annealing of low-pressure chemical vapor deposited amorphous silicon films," M. Appl Phys 63 (7), Apr. 1, 1988, pp. 2260-2266.
International Search Report and Written Opinion from PCT/US2011/044740 dated Feb. 17, 2012, 9 pgs.
International Preliminary Report on Patentability from PCT/US2011/044740 dated Apr. 4, 2013, 6 pgs.
Office Action from Australian Patent Application No. 2011306011 dated Mar. 24, 2014, 4 pgs.
Final Office Action from U.S. Appl. No. 12/890,428 dated Nov. 17, 2014, 17 pgs.
Bierhals, Andreas, Improved understanding of thermally activated structural changes in Al/SIOx/p-Si tunnel diodes by means of infrared spectroscopy, Journal of Applied Physics 83(3), Feb. 1, 1998 pp. 1371-1378.
Hatalis, Miltiadis K., et al., Large grain polycrystalline silicon by low temperature annealing of low pressure chemical vapor deposited amorphous silicon films, Journal of Applied Physics 63(7), Apr. 1, 1988, pp. 2260-2266.
Green, M.L., et al., Understanding the Limits of Ultrathin SiO2 and Si—O—N Gate Dielectrics for Sub-50 nm CMOS, Microelectronics Engineering 48, 1999, pp. 25-30.
Notice of Preliminary Rejection from Korean Patent Application No. 10-2012-7034369 dated Jan. 12, 2017, 7 pgs.
First Office Action and Search Report for Chinese Patent Application No. 20160127549.6 dated Feb. 6, 2017, 5 pgs.
Fai Pre-Interview Communication from U.S. Appl. No. 12/890,428 dated May 10, 2013, 5 pgs.
Non-Final Office Action from U.S. Appl. No. 12/890,428 dated Apr. 28, 2014, 12 pgs.
Bhat, Vishwanath Krishna et al., "Effect of pre-oxidation surface preparation on the growth of ultrathin oxides of silicon," Semicond. Sci. Technol., vol. 14, (1999) pp. 705-709.
Patent Examination Report No. 2 from Australian Patent Application No. 2011306011 dated Mar. 18, 2015, 3 pgs.
First Office Action from Chinese Patent Application No. 201180032856.1 dated Feb. 4, 2015, 12 pgs.
Second Office Action from Chinese Patent Application No. 201180032856.1 dated Jul. 23, 2015, 9 pgs.
Notice of Reasons for Rejection from Japanese Patent Application No. 2013-530147 dated Mar. 24, 2015, 2 pgs.
Notice of Reasons for Rejection from Japanese Patent Application No. 2015-217744 dated Sep. 27, 2016, 2 pgs.
Reexamination Notice for Chinese Patent Office for Chinese Application No. 2016101275496 dated Aug. 6, 2019; 7 pgs.

* cited by examiner

METHOD OF FABRICATING AN EMITTER REGION OF A SOLAR CELL

CROSS-REFERENCE TO RELATED APPLICATIONS

This application is a divisional application of U.S. patent application Ser. No. 12/890,428, filed on Sep. 24, 2010, the entire contents of which are hereby incorporated by reference herein.

GOVERNMENT LICENSE RIGHTS

The invention described herein was made with Governmental support under contract number DE-FC36-07GO17043 awarded by the United States Department of Energy. The Government may have certain rights in the invention.

TECHNICAL FIELD

Embodiments of the present invention are in the field of renewable energy and, in particular, methods of fabricating emitter regions of solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are connected to metal contacts on the solar cell to direct an electrical current from the cell to an external circuit coupled thereto.

Efficiency is an important characteristic of a solar cell as it is directly related to the solar cell's capability to generate power. Accordingly, techniques for increasing the efficiency of solar cells are generally desirable. Embodiments of the present invention allow for increased solar cell efficiency by providing novel processes for fabricating solar cell structures.

DETAILED DESCRIPTION

Methods of fabricating emitter regions of solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithographic and etch techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of fabricating emitter regions of solar cells. In one embodiment, a method of fabricating an emitter region of a solar cell includes forming, in a furnace, a tunnel oxide layer on a surface of a substrate. Without removing the substrate from the furnace, an amorphous layer is formed on the tunnel oxide layer. The amorphous layer is doped to provide a first region having N-type dopants and a second region having P-type dopants. Subsequently, the amorphous layer is heated to provide a polycrystalline layer having an N-type-doped region and a P-type-doped region. In one embodiment, a method of forming layers on a substrate of a solar cell includes loading, into a furnace, a wafer carrier with a plurality of wafers, the wafer carrier having one or more wafer receiving slots loaded with two wafers positioned back-to-back. In the furnace, a tunnel oxide layer is formed on all surfaces of each of the plurality of wafers. Without removing the substrate from the furnace, an amorphous layer is formed on the tunnel oxide layer, the amorphous layer formed on all portions of the tunnel oxide layer except on the portions in contact between wafers positioned back-to-back.

Also disclosed herein are solar cells. In such embodiments, a solar cell includes a substrate or wafer. In one embodiment, a tunnel oxide layer including silicon dioxide is disposed on all surfaces of a silicon wafer. A polycrystalline layer is disposed on the tunnel oxide layer, the polycrystalline layer disposed on all portions of the tunnel oxide layer except on a back side of the silicon wafer which has a ring pattern of the polycrystalline layer. In one embodiment, a tunnel oxide layer including silicon dioxide is disposed on all surfaces of a silicon wafer. An amorphous layer is disposed on the tunnel oxide layer, the amorphous layer disposed on all portions of the tunnel oxide layer except on a back side of the silicon wafer which has a ring pattern of the amorphous layer.

In accordance with an embodiment of the present invention, in order to fabricate a passivated emitter of a solar cell, a thin tunnel oxide and heavily doped poly-silicon, both n-type and p-type, are used. Although such films may conventionally be formed, individually, in furnaces, the combination has not been applied to fabrication of a solar cell, and the manufacturing cost to do may be prohibitive for the solar cell market. Instead, in an embodiment, the oxidation and subsequent silicon deposition are combined into a single process operation. In an embodiment, this approach can also be used to double the throughput by loading two wafers per slot in a furnace boat. In an embodiment, the silicon is first deposited as an undoped and amorphous layer. In that embodiment, the silicon is doped and crystallized in a later processing operation to provide a poly-silicon layer. In an alternative embodiment, the silicon layer is formed as a poly-silicon layer in the single process operation.

Embodiments of the present invention may address conventional fabrication issues such as, but not limited to, (1) control of oxide thickness, and oxide quality, (2) contamination between oxidation and poly deposition, (3) excessive preventative maintenance requirements, (4) throughput, or (5) control of n-poly and p-poly sheet resistance. In accordance with an embodiment of the present invention, several features for a method of solar cell manufacturing are combined, namely the combining of the oxidation and poly (as amorphous silicon first) deposition in a single process. In one embodiment, silicon carbide (SiC) parts are used in the furnace to extend maintenance intervals. In one embodiment, two wafers are loaded per slot to increase throughput. The above embodiments may all contribute to the feasibility of manufacturing solar cells.

In an embodiment, depositing the silicon as an amorphous layer and then doping and crystallizing the layer in a later operation makes the process more controllable and improves the passivation. In an embodiment, throughput is improved by loading two wafers per slot in a furnace handling boat. In an embodiment, an SiC boat is used for dimensional stability. In an embodiment, control of sheet resistance is achieved by, instead of in-situ doped poly-silicon, depositing undoped amorphous silicon. The n and p regions are then formed selectively and crystallized at a later, higher, temperature operation. In an embodiment, by following one or more of the approaches described herein, grain size may be maximized, sheet resistance may be minimized, and counter-doping may be avoided.

It is to be understood that a furnace for film fabrication is not limited to a conventional furnace. In an embodiment, the furnace is a chamber for wafer processing such as, but not limited to, a vertical furnace chamber, a horizontal furnace chamber, or a plasma chamber. It is also to be understood that reference to an amorphous film or layer herein is not limited to an amorphous silicon film or layer. In an embodiment, the amorphous film or layer is a film or layer such as, but not limited to, an amorphous silicon-germanium film or layer or an amorphous carbon-doped silicon film or layer.

Figure 1:
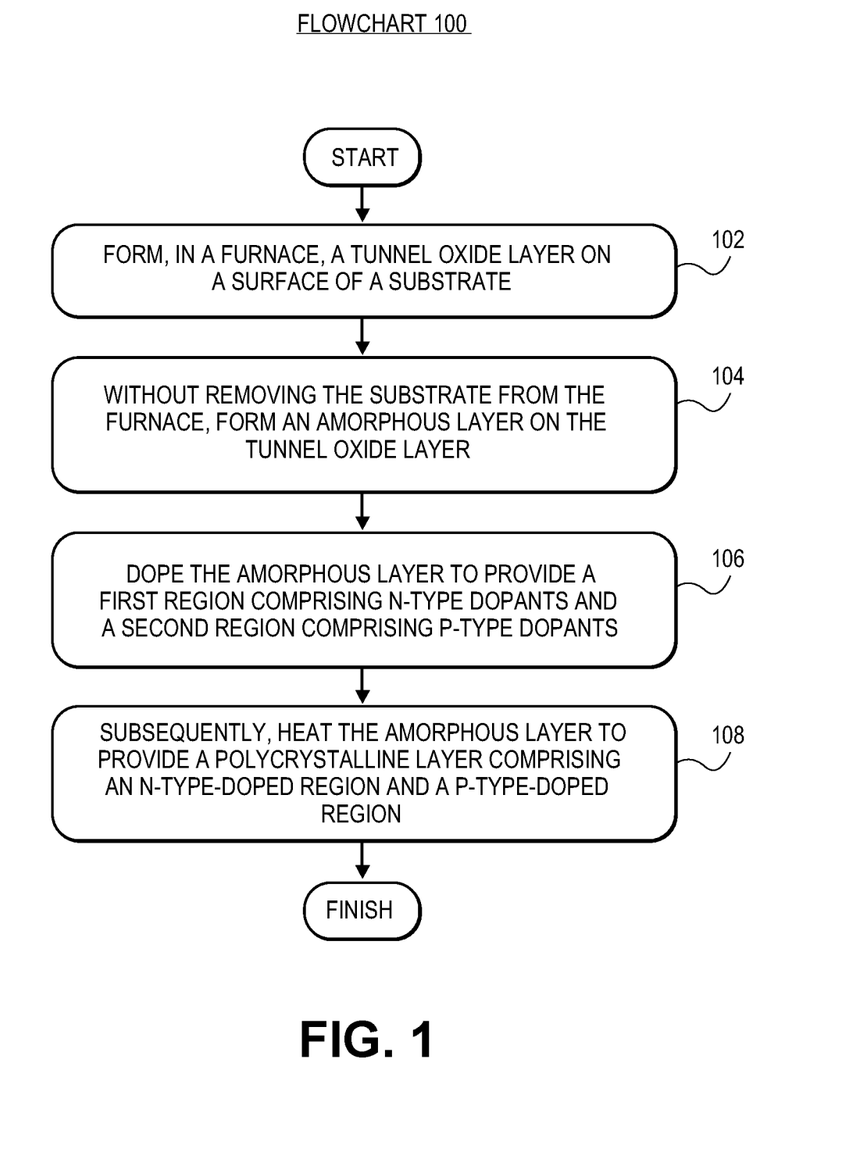
FIG. 1 illustrates a flowchart representing operations in a method of fabricating an emitter region of a solar cell, in accordance with an embodiment of the present invention.

A solar cell may be fabricated to include an emitter region. For example, FIG. 1 illustrates a flowchart 100 representing operations in a method of fabricating an emitter region of a solar cell, in accordance with an embodiment of the present invention. FIGS. 2A-2E illustrate cross-sectional views of various stages in the fabrication of a solar cell including an emitter region, corresponding to operations of flowchart 100, in accordance with an embodiment of the present invention.

Figure 2A:
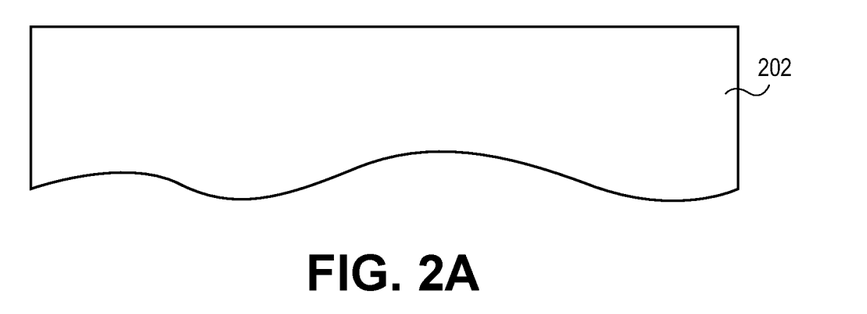
FIG. 2A illustrates a cross-sectional view of a stage in the fabrication of a solar cell including an emitter region, in accordance with an embodiment of the present invention.

Referring to FIG. 2A, a substrate 202 for solar cell manufacturing is provided. In accordance with an embodiment of the present invention, substrate 202 is composed of a bulk silicon substrate. In one embodiment, the bulk silicon substrate is doped with N-type dopants. In an embodiment, substrate 202 has a textured surface, although not depicted in FIG. 2A.

Figure 2B:
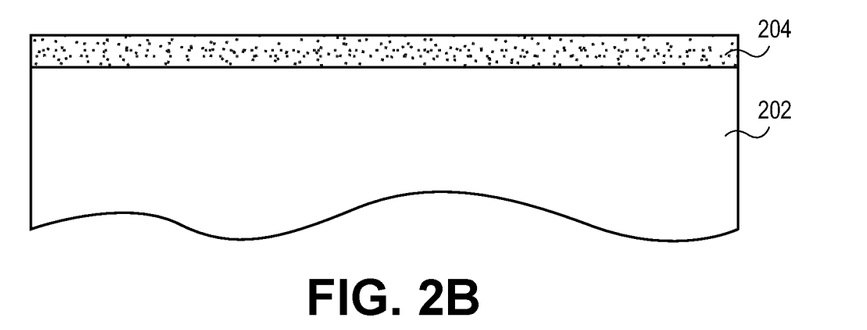
FIG. 2B illustrates a cross-sectional view of a stage in the fabrication of a solar cell including an emitter region, corresponding to operation 102 of the flowchart of FIG. 1, in accordance with an embodiment of the present invention.

Referring to operation 102 of flowchart 100, and corresponding FIG. 2B, a method of fabricating an emitter region of a solar cell includes forming, in a furnace, a tunnel oxide layer 204 on a surface of substrate 202. In accordance with an embodiment of the present invention, forming tunnel oxide layer 204 includes heating substrate 202 in the furnace at a temperature of approximately 900 degrees Celsius. In a specific embodiment, heating substrate 202 in the furnace at the temperature of approximately 900 degrees Celsius further includes heating at a pressure of approximately 500 mTorr for approximately 3 minutes in an atmosphere of oxygen to provide tunnel oxide layer 204 having a thickness of approximately 1.5 nanometers. In accordance with another embodiment of the present invention, forming tunnel oxide layer 204 includes heating substrate 202 in the furnace at a temperature less than 600 degrees Celsius. In a specific embodiment, heating substrate 202 in the furnace at the temperature of less than 600 degrees Celsius further includes heating at a temperature of approximately 565 degrees Celsius, at a pressure of approximately 300 Torr, for approximately 60 minutes in an atmosphere of oxygen to provide tunnel oxide layer 204 having a thickness of approximately 1.5 nanometers. In an alternative embodiment, the atmosphere include $N_2O$.

Figure 2C:
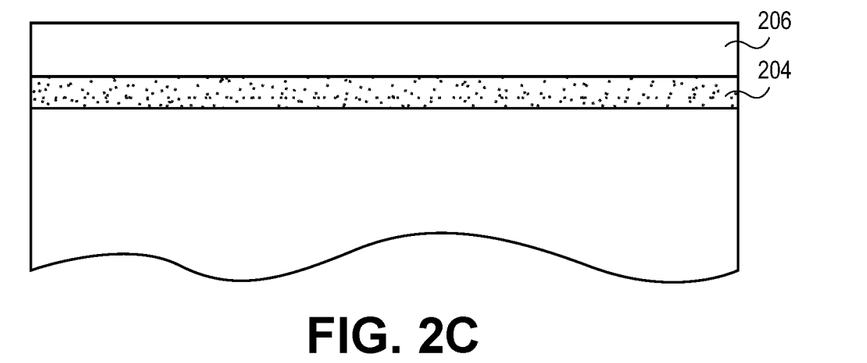
FIG. 2C illustrates a cross-sectional view of a stage in the fabrication of a solar cell including an emitter region, corresponding to operation 104 of the flowchart of FIG. 1, in accordance with an embodiment of the present invention.

Referring to operation 104 of flowchart 100, and corresponding FIG. 2C, the method of fabricating an emitter region of a solar cell further includes, without removing substrate 202 from the furnace, forming an amorphous layer 206 on tunnel oxide layer 204. In accordance with an embodiment of the present invention, forming amorphous layer 206 includes depositing amorphous layer 206 in the furnace at a temperature less than 575 degrees Celsius. In a specific embodiment, depositing amorphous layer 206 in the furnace at the temperature less than 575 degrees Celsius further includes heating at a temperature of approximately 565 degrees Celsius, at a pressure of approximately 350 mTorr, and in an atmosphere of silane ($SiH_4$) to provide amorphous layer 206 having a thickness approximately in the range of 200-300 nanometers.

Figure 2D:
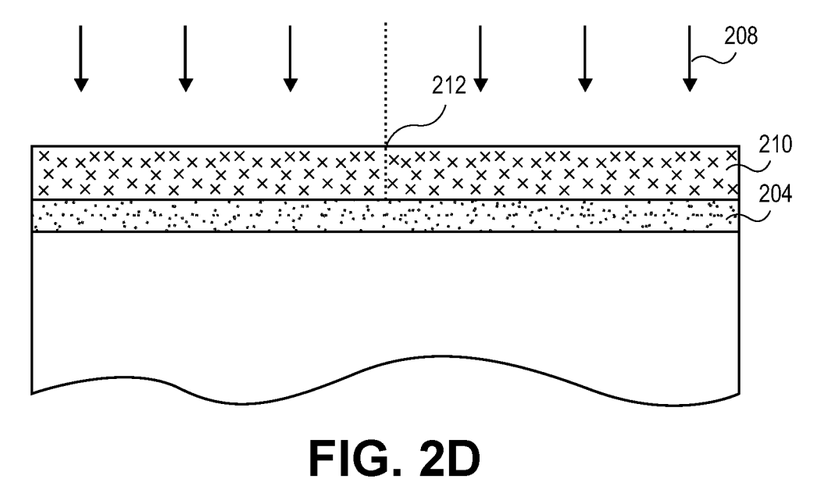
FIG. 2D illustrates a cross-sectional view of a stage in the fabrication of a solar cell including an emitter region, corresponding to operation 106 of the flowchart of FIG. 1, in accordance with an embodiment of the present invention.

Referring to operation 106 of flowchart 100, and corresponding FIG. 2D, the method of fabricating an emitter region of a solar cell further includes doping amorphous layer 206 with dopants 208 to provide a doped amorphous layer 210 having a first region (left side of p-n junction 212) including N-type dopants and a second region (right side of p-n junction 212) including P-type dopants. In one embodiment, the dopants are introduced from a solid-state source. In another embodiment, the dopants are introduced as implanted atoms or ions.

Figure 2E:
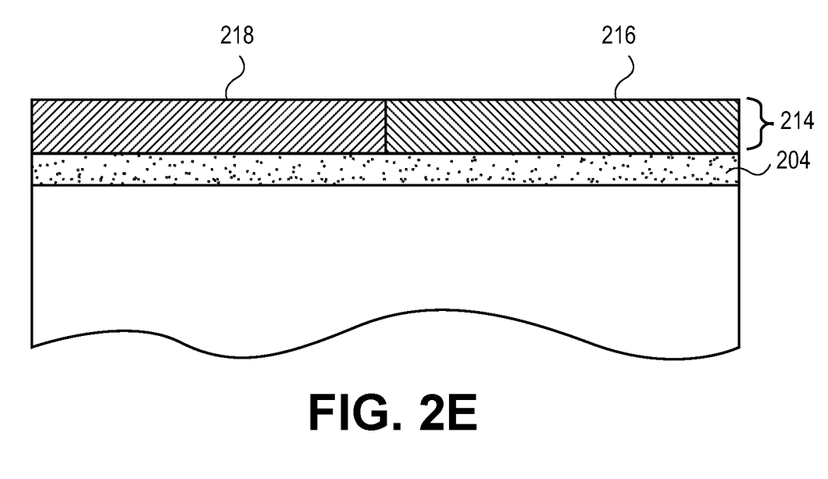
FIG. 2E illustrates a cross-sectional view of a stage in the fabrication of a solar cell including an emitter region, corresponding to operation 108 of the flowchart of FIG. 1, in accordance with an embodiment of the present invention.

Referring to operation 108 of flowchart 100, and corresponding FIG. 2E, the method of fabricating an emitter region of a solar cell further includes, subsequently, heating doped amorphous layer 210 to provide a polycrystalline layer 214 having an N-type-doped region 218 and a P-type-doped region 216. In accordance with an embodiment of the present invention, substrate 202 is composed of silicon, tunnel oxide layer 204 is composed of silicon dioxide, amorphous layer 206 is composed of silicon, the N-type dopants are phosphorous dopants, and the P-type dopants are boron dopants. In an embodiment, both tunnel oxide layer 204 and amorphous layer 206 are formed at a temperature of approximately 565 degrees Celsius, and heating doped amorphous layer 210 to provide polycrystalline layer 214 includes heating at a temperature of approximately 980 degrees Celsius.

In order to further or complete fabrication of a solar cell, the method above may further include forming a metal contact above polycrystalline layer 214. In an embodiment, a completed solar cell is a back-contact solar cell. In that embodiment, N-type-doped region 218 and P-type-doped region 216 are active regions. Conductive contacts may be coupled to the active regions and separated from one another by isolation regions, which may be composed of a dielectric material. In an embodiment, the solar cell is a back-contact solar cell and further includes an anti-reflective coating layer disposed on a light-receiving surface, such as on a random textured surface of the solar cell.

Figure 3:
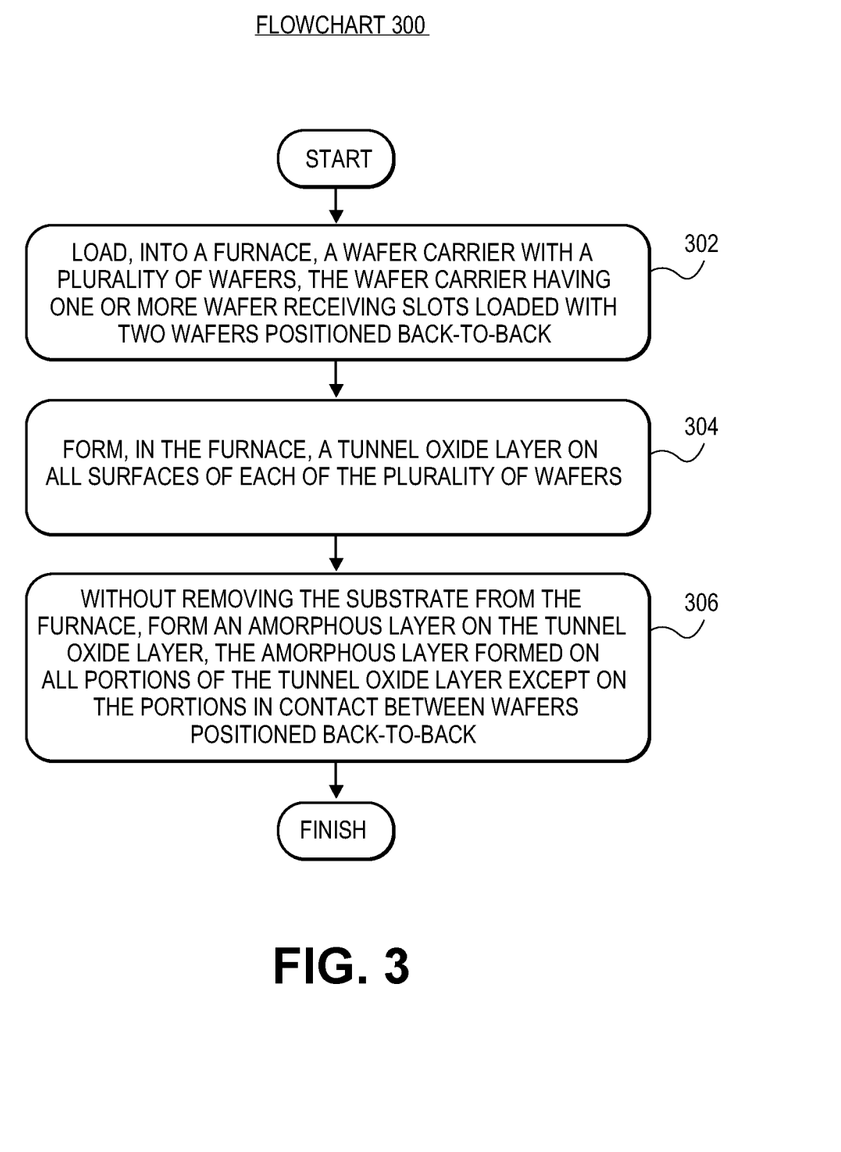
FIG. 3 illustrates a flowchart representing operations in a method of forming layers on a substrate of a solar cell, in accordance with an embodiment of the present invention.
Figure 4A:
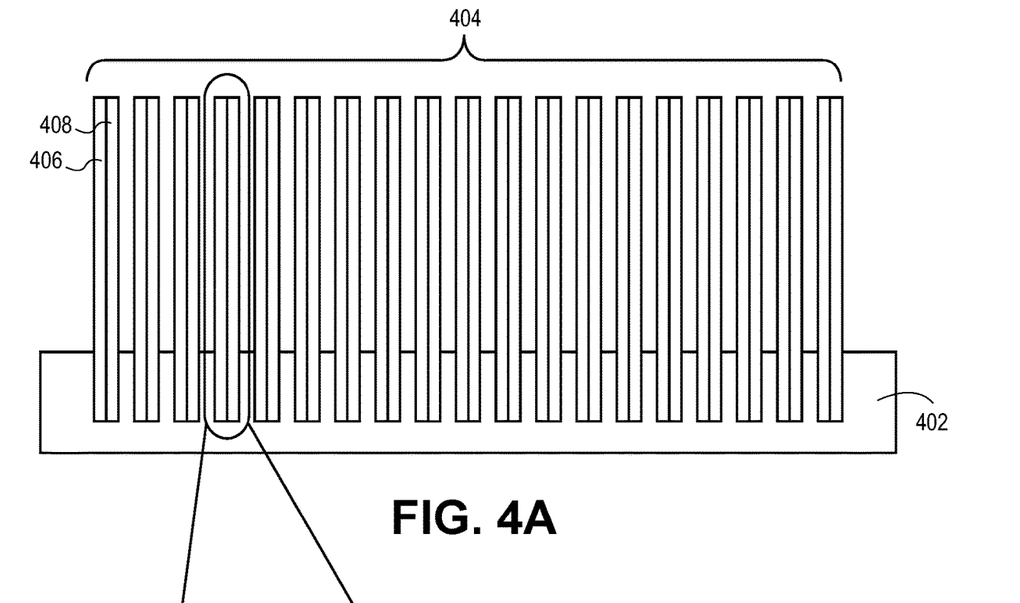
FIG. 4A illustrates a cross-sectional view of a stage in the fabrication of solar cells, corresponding to operation 302 of the flowchart of FIG. 3, in accordance with an embodiment of the present invention.
Figure 4B:
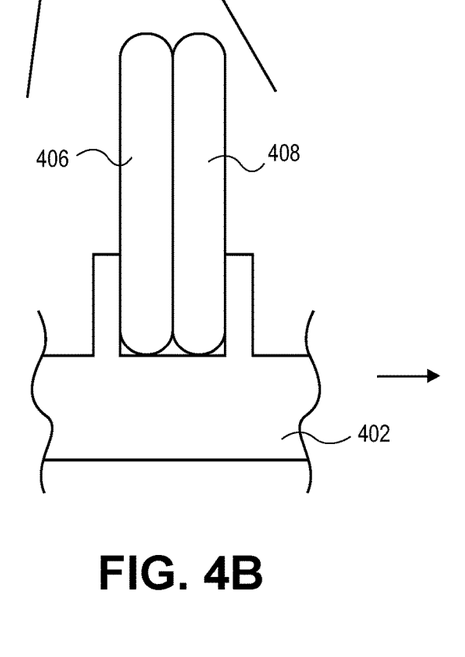
FIG. 4B illustrates a magnified view of a portion of FIG. 4A, in accordance with an embodiment of the present invention.
Figure 4C:
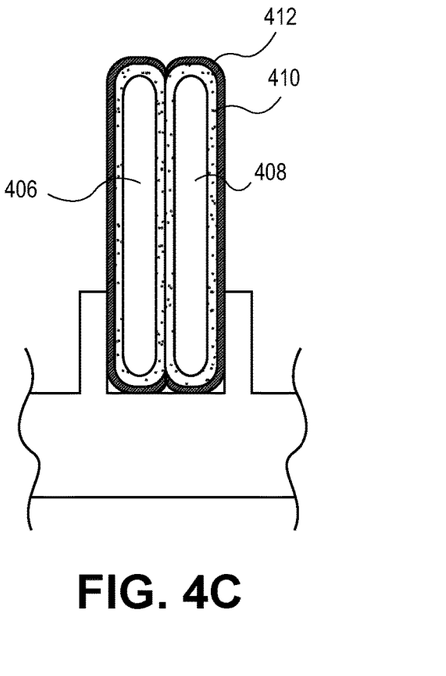
FIG. 4C illustrates a cross-sectional view of a stage in the fabrication of solar cells, corresponding to operations 304 and 306 of the flowchart of FIG. 3, in accordance with an embodiment of the present invention.

In another aspect of the present invention, unique approaches to forming layers on a substrate of a solar cell are provided. For example, FIG. 3 illustrates a flowchart 300 representing operations in a method of forming layers on a substrate of a solar cell, in accordance with an embodiment of the present invention. FIGS. 4A-4C illustrate cross-sectional views of various stages in the fabrication of solar cells, corresponding to operations of flowchart 300, in accordance with an embodiment of the present invention.

Referring to operation 302 of flowchart 300, and corresponding FIGS. 4A and 4B, a method of forming layers on a substrate of a solar cell includes loading, into a furnace, a wafer carrier 402 with a plurality of wafers 404, wafer carrier 402 having one or more wafer receiving slots loaded with two wafers positioned back-to-back, such as wafers 406 and 408. In accordance with an embodiment of the present invention, 50 wafers are loaded into 25 slots of a carrier 402.

Referring to operation 304 of flowchart 300, and corresponding FIG. 4C, the method of forming layers on a substrate of a solar cell further includes forming, in the furnace, a tunnel oxide layer 410 on all surfaces of each of the plurality of wafers 404, e.g., on all surfaces of wafers 406 and 408, as depicted in FIG. 4C. In accordance with an embodiment of the present invention, forming tunnel oxide layer 410 includes heating each of the plurality of wafers 404 in the furnace at a temperature of approximately 900 degrees Celsius. In a specific embodiment, heating each of the plurality of wafers 404 in the furnace at the temperature of approximately 900 degrees Celsius further includes heating at a pressure of approximately 500 mTorr for approximately 3 minutes in an atmosphere of oxygen to provide tunnel oxide layer 410 having a thickness of approximately 1.5 nanometers. In accordance with another embodiment of the present invention, forming tunnel oxide layer 410 includes heating each of the plurality of wafers 404 in the furnace at a temperature less than 600 degrees Celsius. In a specific embodiment, heating each of the plurality of wafers 404 in the furnace at the temperature of less than 600 degrees Celsius further includes heating at a temperature of approximately 565 degrees Celsius, at a pressure of approximately 300 Torr, for approximately 60 minutes in an atmosphere of oxygen to provide tunnel oxide layer 410 having a thickness of approximately 1.5 nanometers. In an alternative embodiment, the atmosphere include $N_2O$.

Referring to operation 304 of flowchart 300, and corresponding FIG. 4C, the method of forming layers on a substrate of a solar cell further includes, without removing the plurality of wafers 404 from the furnace, forming an amorphous layer 412 on tunnel oxide layer 410, amorphous layer 412 formed on all portions of tunnel oxide layer 410 except on the portions in contact between wafers positioned back-to-back, e.g., as depicted with reference to wafers 406 and 408 in FIG. 4C. In accordance with an embodiment of the present invention, for the wafers positioned back-to-back, a ring pattern of the amorphous layer is formed on the back of each wafer, as described in more detail below with respect to FIG. 5. In an embodiment, each of the plurality of wafers 404 is composed of silicon, tunnel oxide layer 410 is composed of silicon dioxide, and amorphous layer 412 is composed of silicon. In an embodiment, forming amorphous layer 412 includes depositing amorphous layer 412 in the furnace at a temperature less than 575 degrees Celsius. In a specific embodiment, depositing amorphous layer 412 in the furnace at the temperature less than 575 degrees Celsius further includes heating at a temperature of approximately 565 degrees Celsius at a pressure of approximately 350 mTorr in an atmosphere of silane ($SiH_4$) to provide amorphous layer 412 having a thickness approximately in the range of 200-300 nanometers. In an embodiment, the temperature is kept below 575 degrees Celsius to avoid crystallization of the formed layer, but not substantially below 575 degrees Celsius for the sake of maintaining a deposition rate suitable for high volume manufacturing.

In accordance with an embodiment of the present invention, the method of forming layers on a substrate of a solar cell further includes, subsequent to forming amorphous layer 412, applying a cleaning solution to the back of each wafer, the cleaning solution including an oxidizing agent. A texturizing solution is then applied to the back of each wafer, the texturizing solution including a hydroxide. In one embodiment, the oxidizing agent is a species such as, but not limited to, ozone or hydrogen peroxide ($H_2O_2$), and the hydroxide is a species such as, but not limited to, potassium hydroxide (KOH) or sodium hydroxide (NaOH).

The texturizing solution may provide a randomly textured (rantex) surface on a light-receiving portion of a fabricated solar cell. In accordance with an embodiment of the present invention, by introducing a cleaning solution having an oxidizing agent prior to introducing the texturizing solution, the texturing of the solar cell is uniform despite the initial presence of a ring portion of a layer fabricated on the solar cell substrate, as described below in association with FIG. 5.

A ring feature, as mentioned with respect to FIG. 4C, may be retained on a substrate of a solar cell, or may be subsequently removed. Nonetheless, a solar cell structure may ultimately retain, or at least temporarily include, such a ring feature. For example, FIG. 5 illustrates both a cross-sectional view and a top-down view of a substrate of a solar cell, the substrate having layers formed thereon, in accordance with an embodiment of the present invention.

Figure 5:
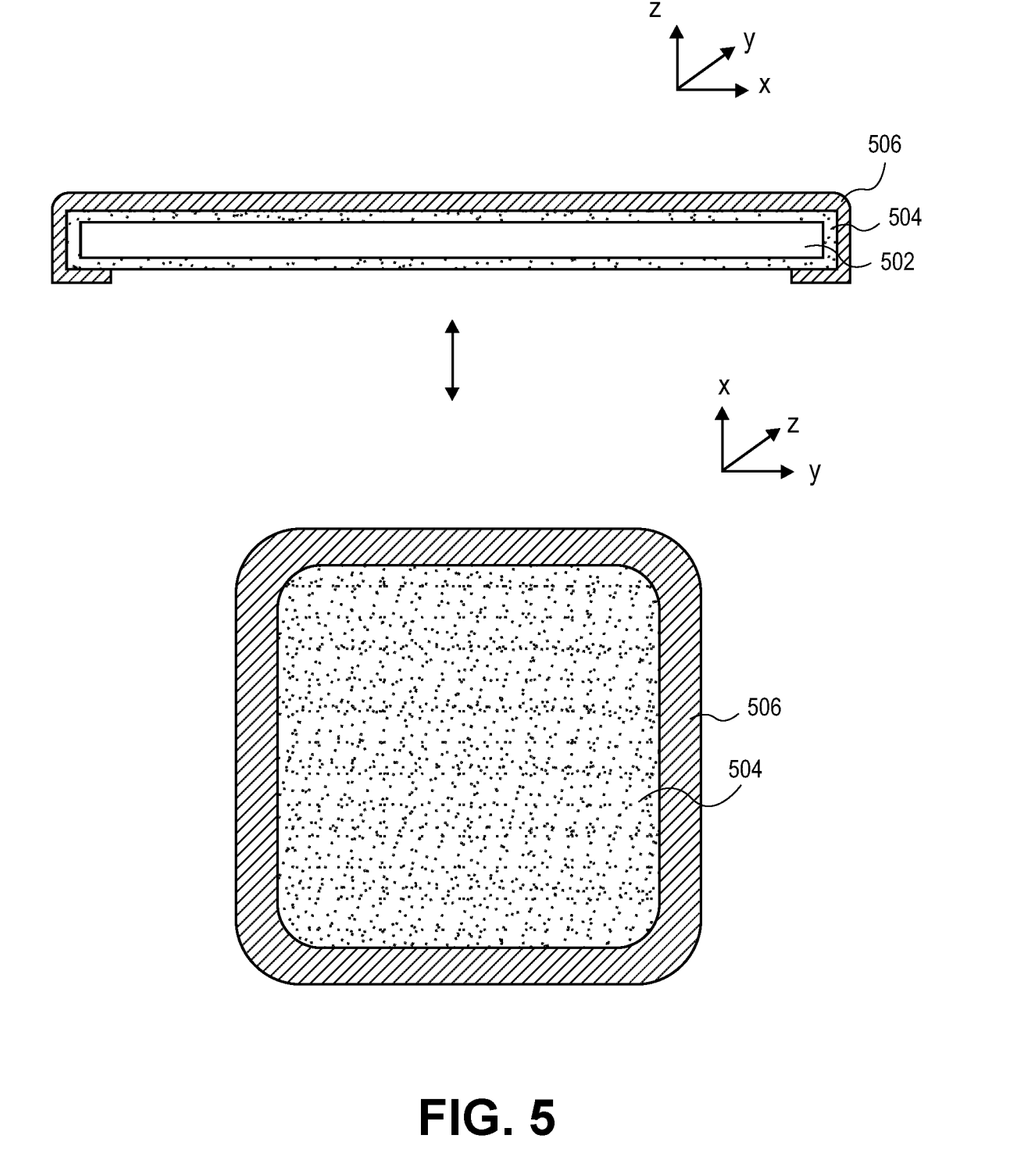
FIG. 5 illustrates both a cross-sectional view and a top-down view of a substrate of a solar cell, the substrate having layers formed thereon, in accordance with an embodiment of the present invention.

Referring to FIG. 5, in accordance with an embodiment of the present invention, a substrate of a solar cell includes a tunnel oxide layer 504 disposed on all surfaces of a wafer 502. A polycrystalline layer 506 is disposed on tunnel oxide layer 504, polycrystalline layer 506 disposed on all portions of tunnel oxide layer 504 except on a back side of wafer 502 which includes a ring pattern of polycrystalline layer 506. In accordance with an embodiment of the present invention, the ring pattern results from the back-to-back handling of pairs of wafers, as described in association with FIG. 4C. In an embodiment, tunnel oxide layer 504 is composed of silicon dioxide, wafer 502 is composed of silicon, and polycrystalline layer 506 is composed of silicon.

Referring again to FIG. 5, in accordance with another embodiment of the present invention, a substrate of a solar cell includes a tunnel oxide layer 504 disposed on all surfaces of a wafer 502. An amorphous layer 506 is disposed on tunnel oxide layer 504, amorphous layer 506 disposed on all portions of tunnel oxide layer 504 except on a back side of wafer 502 which includes a ring pattern of amorphous layer 506. In accordance with an embodiment of the present invention, the ring pattern results from the back-to-back handling of pairs of wafers, as described in association with FIG. 4C. In an embodiment, tunnel oxide layer 504 is composed of silicon dioxide, wafer 502 is composed of silicon, and amorphous layer 506 is composed of silicon.

Thus, methods of fabricating emitter regions for solar cells have been disclosed. In accordance with an embodiment of the present invention, a method of fabricating an emitter region of a solar cell includes forming, in a furnace, a tunnel oxide layer on a surface of a substrate. The method also includes, without removing the substrate from the furnace, forming an amorphous layer on the tunnel oxide layer. The method also includes doping the amorphous layer to provide a first region having N-type dopants and a second region having P-type dopants. Subsequently, the amorphous layer is heated to provide a polycrystalline layer having an N-type-doped region and a P-type-doped region. In one embodiment, the substrate is composed of silicon, the tunnel oxide layer is composed of silicon dioxide, the amorphous layer is composed of silicon, the N-type dopants are phosphorous, and the P-type dopants are boron. In one embodiment, both the tunnel oxide layer and the amorphous layer are formed at a temperature of approximately 565 degrees Celsius, and heating the amorphous layer to provide the polycrystalline layer includes heating at a temperature of approximately 980 degrees Celsius.

What is claimed is:

1. A method of forming layers on a substrate of a solar cell, the method comprising:
   loading, into a furnace, a wafer carrier with a plurality of wafers, the wafer carrier having one or more wafer receiving slots loaded with two wafers positioned back-to-back;
   forming, in the furnace, a tunnel oxide layer on all surfaces of each of the plurality of wafers; and, without removing the plurality of wafers from the furnace,
   forming an amorphous layer on the tunnel oxide layer, the amorphous layer formed on all portions of the tunnel oxide layer except on the portions in contact between wafers positioned back-to-back, wherein for the wafers positioned back-to-back, a ring pattern of the amorphous layer is formed on the back of each wafer.

2. The method of claim 1, further comprising:
   subsequent to forming the amorphous layer, applying a cleaning solution to the back of each wafer, the cleaning solution comprising an oxidizing agent; and, subsequently,
   applying a texturizing solution to the back of each wafer, the texturizing solution comprising a hydroxide.

3. The method of claim 2, where in the oxidizing agent is selected from the group consisting of ozone and hydrogen peroxide ($H_2O_2$), and wherein the hydroxide is selected from the group consisting of potassium hydroxide (KOH) and sodium hydroxide (NaOH).

4. The method of claim 1, wherein each of the plurality of wafers comprises silicon, the tunnel oxide layer comprises silicon dioxide, and the amorphous layer comprises silicon.

5. The method of claim 1, wherein forming the tunnel oxide layer comprises heating each of the plurality of wafers in the furnace at a temperature of approximately 900 degrees Celsius.

6. The method of claim 5, wherein heating each of the plurality of wafers in the furnace at the temperature of approximately 900 degrees Celsius further comprises heating at a pressure of approximately 500 mTorr for approximately 3 minutes in an atmosphere of oxygen to provide the tunnel oxide layer having a thickness of approximately 1.5 nanometers.

7. The method of claim 1, wherein forming the tunnel oxide layer comprises heating each of the plurality of wafers in the furnace at a temperature less than 600 degrees Celsius.

8. The method of claim 7, wherein heating each of the plurality of wafers in the furnace at the temperature of less than 600 degrees Celsius further comprises heating at a temperature of approximately 565 degrees Celsius, at a pressure of approximately 300 Torr, for approximately 60 minutes in an atmosphere of oxygen to provide the tunnel oxide layer having a thickness of approximately 1.5 nanometers.

9. The method of claim 1, wherein forming the amorphous layer comprises depositing the amorphous layer in the furnace at a temperature less than 575 degrees Celsius.

10. The method of claim 9, wherein depositing the amorphous layer in the furnace at the temperature less than 575 degrees Celsius further comprises heating at a temperature of approximately 565 degrees Celsius at a pressure of approximately 350 mTorr in an atmosphere of silane ($SiH_4$) to provide the amorphous layer having a thickness approximately in the range of 200-300 nanometers.

11. A method of forming layers on a substrate of a solar cell, the method comprising:
   loading, into a furnace, a wafer carrier with a plurality of wafers, the wafer carrier having one or more wafer receiving slots loaded with two wafers positioned back-to-back;
   forming, in the furnace, a tunnel oxide layer on all surfaces of each of the plurality of wafers, wherein forming the tunnel oxide layer comprises heating each of the plurality of wafers in the furnace at a temperature of approximately 900 degrees Celsius, wherein heating each of the plurality of wafers in the furnace at the temperature of approximately 900 degrees Celsius further comprises heating at a pressure of approximately 500 mTorr for approximately 3 minutes in an atmosphere of oxygen to provide the tunnel oxide layer having a thickness of approximately 1.5 nanometers; and, without removing the plurality of wafers from the furnace,
   forming an amorphous layer on the tunnel oxide layer, the amorphous layer formed on all portions of the tunnel oxide layer except on the portions in contact between wafers positioned back-to-back.

12. The method of claim 11, wherein each of the plurality of wafers comprises silicon, the tunnel oxide layer comprises silicon dioxide, and the amorphous layer comprises silicon.

13. A method of forming layers on a substrate of a solar cell, the method comprising:
   loading, into a furnace, a wafer carrier with a plurality of wafers, the wafer carrier having one or more wafer receiving slots loaded with two wafers positioned back-to-back;
   forming, in the furnace, a tunnel oxide layer on all surfaces of each of the plurality of wafers, wherein forming the tunnel oxide layer comprises heating each of the plurality of wafers in the furnace at a temperature less than 600 degrees Celsius, wherein heating each of the plurality of wafers in the furnace at the temperature of less than 600 degrees Celsius further comprises heating at a temperature of approximately 565 degrees Celsius, at a pressure of approximately 300 Torr, for approximately 60 minutes in an atmosphere of oxygen to provide the tunnel oxide layer having a thickness of approximately 1.5 nanometers; and, without removing the plurality of wafers from the furnace, forming an amorphous layer on the tunnel oxide layer, the amorphous layer formed on all portions of the tunnel oxide layer except on the portions in contact between wafers positioned back-to-back.

14. The method of claim 13, wherein each of the plurality of wafers comprises silicon, the tunnel oxide layer comprises silicon dioxide, and the amorphous layer comprises silicon.

15. A method of forming layers on a substrate of a solar cell, the method comprising:

loading, into a furnace, a wafer carrier with a plurality of wafers, the wafer carrier having one or more wafer receiving slots loaded with two wafers positioned back-to-back;

forming, in the furnace, a tunnel oxide layer on all surfaces of each of the plurality of wafers, wherein forming the amorphous layer comprises depositing the amorphous layer in the furnace at a temperature less than 575 degrees Celsius, wherein depositing the amorphous layer in the furnace at the temperature less than 575 degrees Celsius further comprises heating at a temperature of approximately 565 degrees Celsius at a pressure of approximately 350 mTorr in an atmosphere of silane ($SiH_4$) to provide the amorphous layer having a thickness approximately in the range of 200-300 nanometers; and, without removing the plurality of wafers from the furnace, forming an amorphous layer on the tunnel oxide layer, the amorphous layer formed on all portions of the tunnel oxide layer except on the portions in contact between wafers positioned back-to-back.

16. The method of claim 15, wherein each of the plurality of wafers comprises silicon, the tunnel oxide layer comprises silicon dioxide, and the amorphous layer comprises silicon.

17. The method of claim 11, further comprising:

subsequent to forming the amorphous layer, applying a cleaning solution to the back of each wafer, the cleaning solution comprising an oxidizing agent; and, subsequently, applying a texturizing solution to the back of each wafer, the texturizing solution comprising a hydroxide.

18. The method of claim 13, further comprising:

subsequent to forming the amorphous layer, applying a cleaning solution to the back of each wafer, the cleaning solution comprising an oxidizing agent; and, subsequently, applying a texturizing solution to the back of each wafer, the texturizing solution comprising a hydroxide.

19. The method of claim 15, further comprising:

subsequent to forming the amorphous layer, applying a cleaning solution to the back of each wafer, the cleaning solution comprising an oxidizing agent; and, subsequently, applying a texturizing solution to the back of each wafer, the texturizing solution comprising a hydroxide.

20. The method of claim 19, where in the oxidizing agent is selected from the group consisting of ozone and hydrogen peroxide ($H_2O_2$), and wherein the hydroxide is selected from the group consisting of potassium hydroxide (KOH) and sodium hydroxide (NaOH).

* * * * *